United States Patent
Ilchenko et al.

(10) Patent No.: US 7,184,451 B2
(45) Date of Patent: Feb. 27, 2007

(54) CONTINUOUSLY TUNABLE COUPLED OPTO-ELECTRONIC OSCILLATORS HAVING BALANCED OPTO-ELECTRONIC FILTERS

(75) Inventors: Vladimir Ilchenko, Arcadia, CA (US); Danny Eliyahu, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 286 days.

(21) Appl. No.: 11/002,731

(22) Filed: Dec. 1, 2004

(65) Prior Publication Data
US 2005/0185681 A1  Aug. 25, 2005

Related U.S. Application Data

(63) Continuation-in-part of application No. 10/963,755, filed on Oct. 12, 2004.
(60) Provisional application No. 60/511,431, filed on Oct. 15, 2003.

(51) Int. Cl.
*H01S 3/10* (2006.01)
(52) U.S. Cl. ............ 372/20; 372/29.011; 372/50.123
(58) Field of Classification Search ............ 372/20, 372/29.011, 50.123
See application file for complete search history.

(56) References Cited

U.S. PATENT DOCUMENTS

| | | | |
|---|---|---|---|
| 5,204,640 A | 4/1993 | Logan | |
| 5,220,292 A | 6/1993 | Bianchini et al. | |
| 5,723,856 A | 3/1998 | Yao et al. | |
| 5,777,778 A | 7/1998 | Yao | |
| 5,917,179 A | 6/1999 | Yao | |
| 5,929,430 A | 7/1999 | Yao et al. | |
| 6,014,217 A * | 1/2000 | Sanders et al. | 356/461 |
| 6,389,197 B1 | 5/2002 | Iltchenko et al. | |
| 6,417,957 B1 | 7/2002 | Yao | |
| 6,473,218 B1 | 10/2002 | Maleki et al. | |
| 6,476,959 B2 | 11/2002 | Yao | |
| 6,487,233 B2 | 11/2002 | Maleki et al. | |
| 6,488,861 B2 | 12/2002 | Iltchenko et al. | |
| 6,490,039 B2 | 12/2002 | Maleki et al. | |
| 6,138,076 A1 | 3/2003 | Yao | |
| 6,535,328 B2 | 3/2003 | Yao | |
| 6,567,436 B1 | 5/2003 | Yao et al. | |
| 6,580,532 B1 | 6/2003 | Yao et al. | |
| 6,594,061 B2 | 7/2003 | Huang et al. | |
| 6,762,869 B2 * | 7/2004 | Maleki et al. | 359/239 |
| 6,871,025 B2 | 3/2005 | Maleki et al. | |
| 6,906,309 B2 | 6/2005 | Sayyah et al. | |
| 2002/0018611 A1 | 2/2002 | Maleki et al. | |
| 2003/0012504 A1 | 1/2003 | Iltchenko | |

OTHER PUBLICATIONS

Logan, et al.; Stabilization of Oscillator Phase Using a Fiber-Optic Delay-Line; 1991; 45th Annual Symposium on Frequency Control; pp. 508-512.

(Continued)

*Primary Examiner*—Michael T. Nguyen
(74) *Attorney, Agent, or Firm*—Fish & Richardson P.C.

(57) ABSTRACT

Devices and techniques for achieving continuous tuning of coupled opto-electronic oscillators with signal filtering in RF or microwave frequencies by optical filtering via two optical resonators in two separate optical paths.

22 Claims, 13 Drawing Sheets

OTHER PUBLICATIONS

L.E. Myers, et al.; Quasi-phase-matched optical parametric oscillators in bulk periodically poled $LiNbO_3$; Nov. 1995; J.Opt. Soc. Am. B/vol. 12, No. 11; pp. 2102-2116.

X. Steve Yao, et al.; Converting Light into Spectrally Pure Microwave Oscillation; Apr. 1996; Optics Letters, vol. 21, No. 7; pp. 483-485.

H. Ito, et al.; InP/InGaAs uni-travelling-carrier photodiode with 310 GHz receiver; Oct. 12, 2000; Electronics Letters, vol. 36, No. 21; pp. 1809-1810.

V. Ilchenko, et al.; Sub-Micro Watt Photonic Microwave Receiver; Nov. 2002; IEEE Photonics Technology Letters, vol. 14, No. 11; pp. 1602-1604.

\* cited by examiner

FIG. 8A $S_{21}$ ($\Delta f=0$)
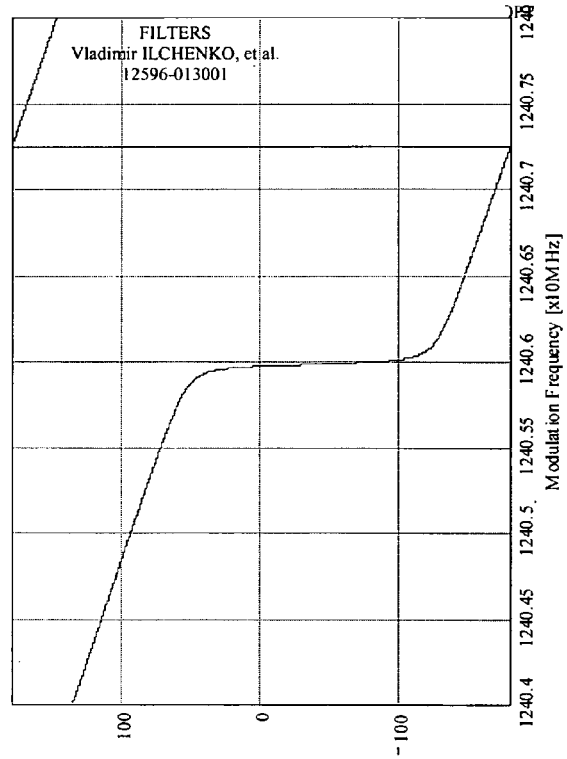
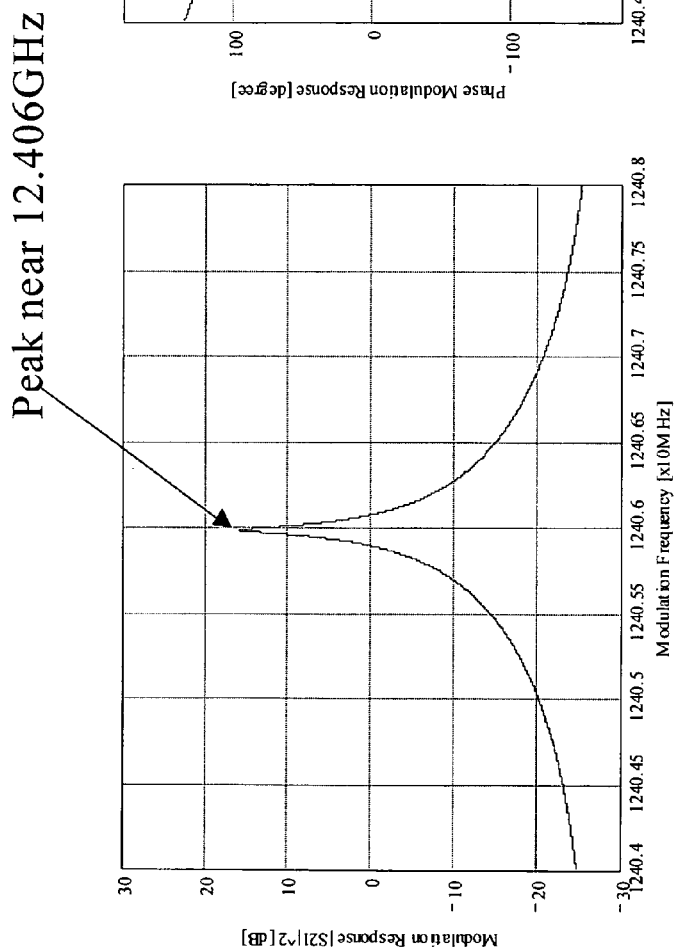

FIG. 8B  $S_{21}$ ($\Delta f = -1\text{MHz}$)
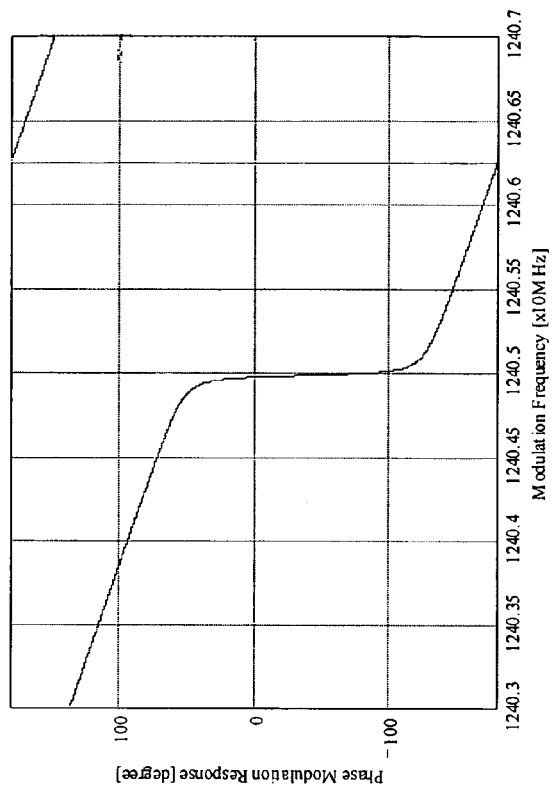
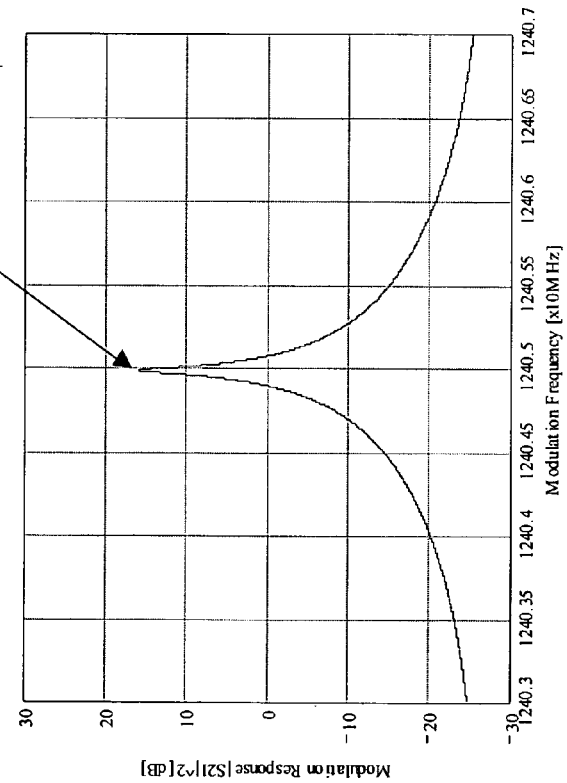
Peak near 12.405GHz

FIG. 8C
$S_{21}$ ($\Delta f = -10$MHz)
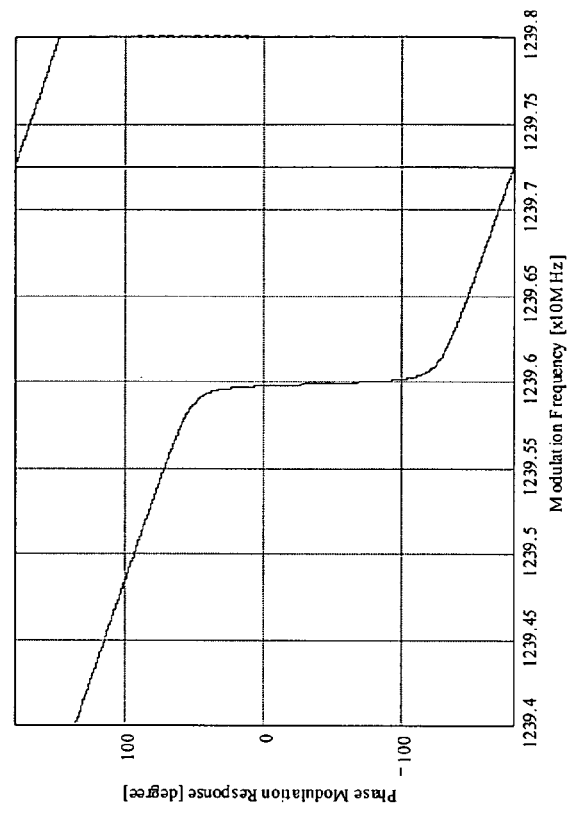
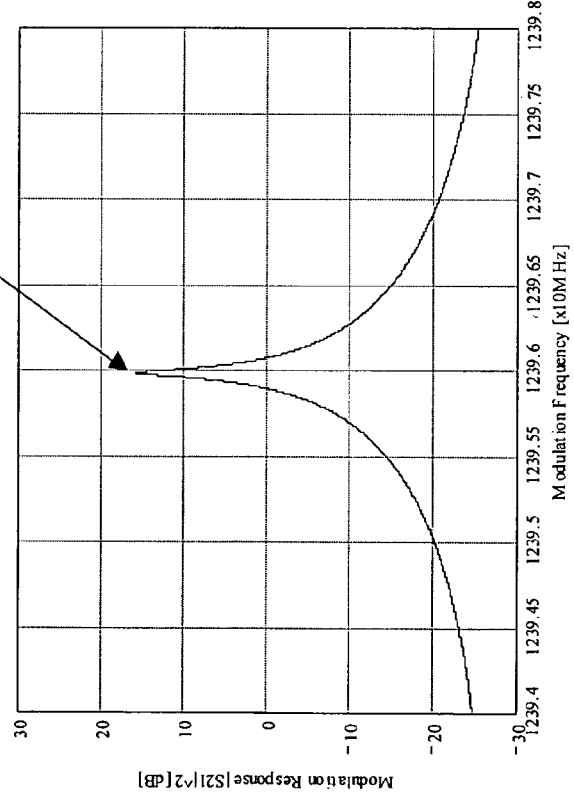
Peak near 12.396GHz

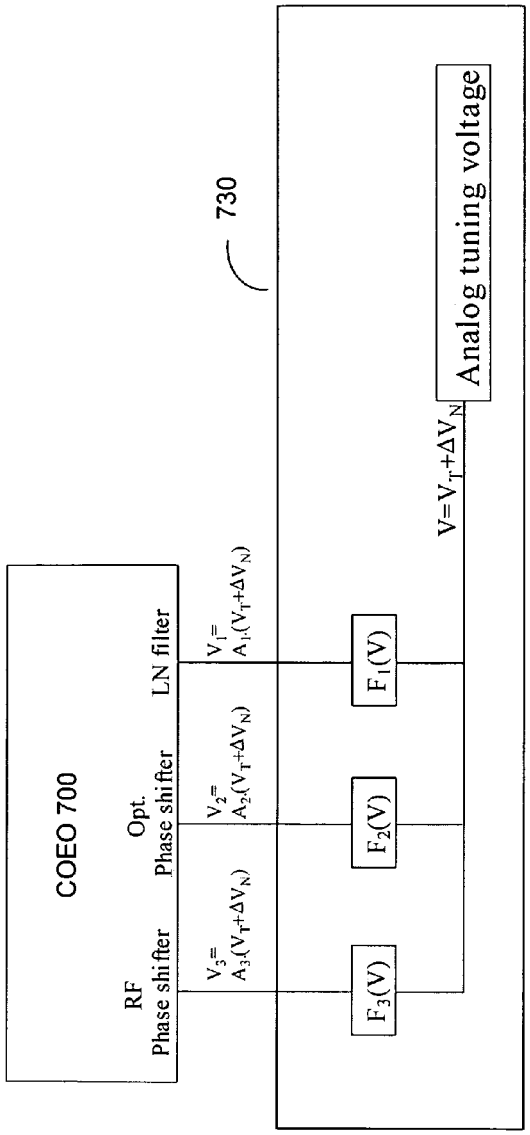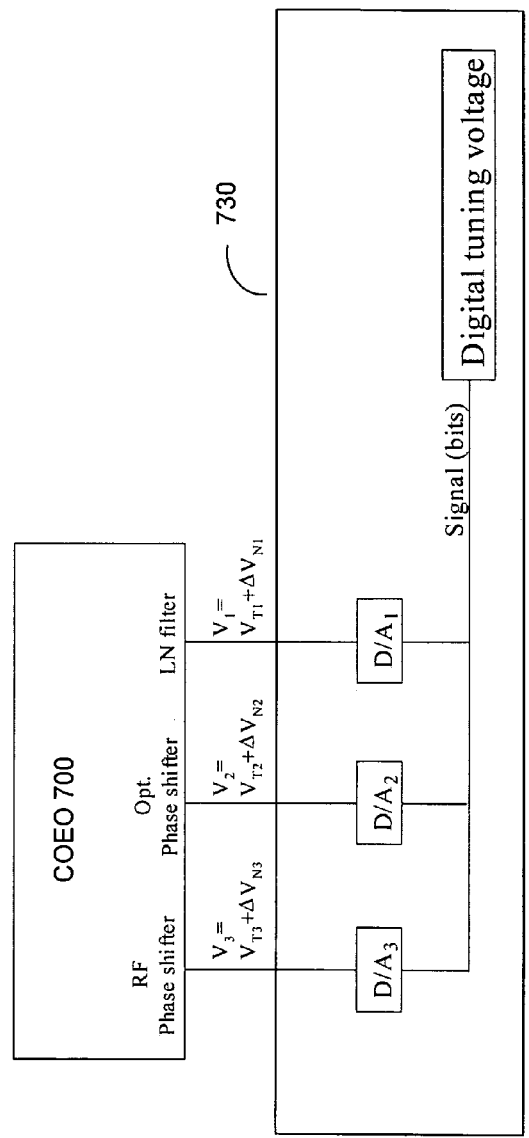
FIG. 9A
FIG. 9B

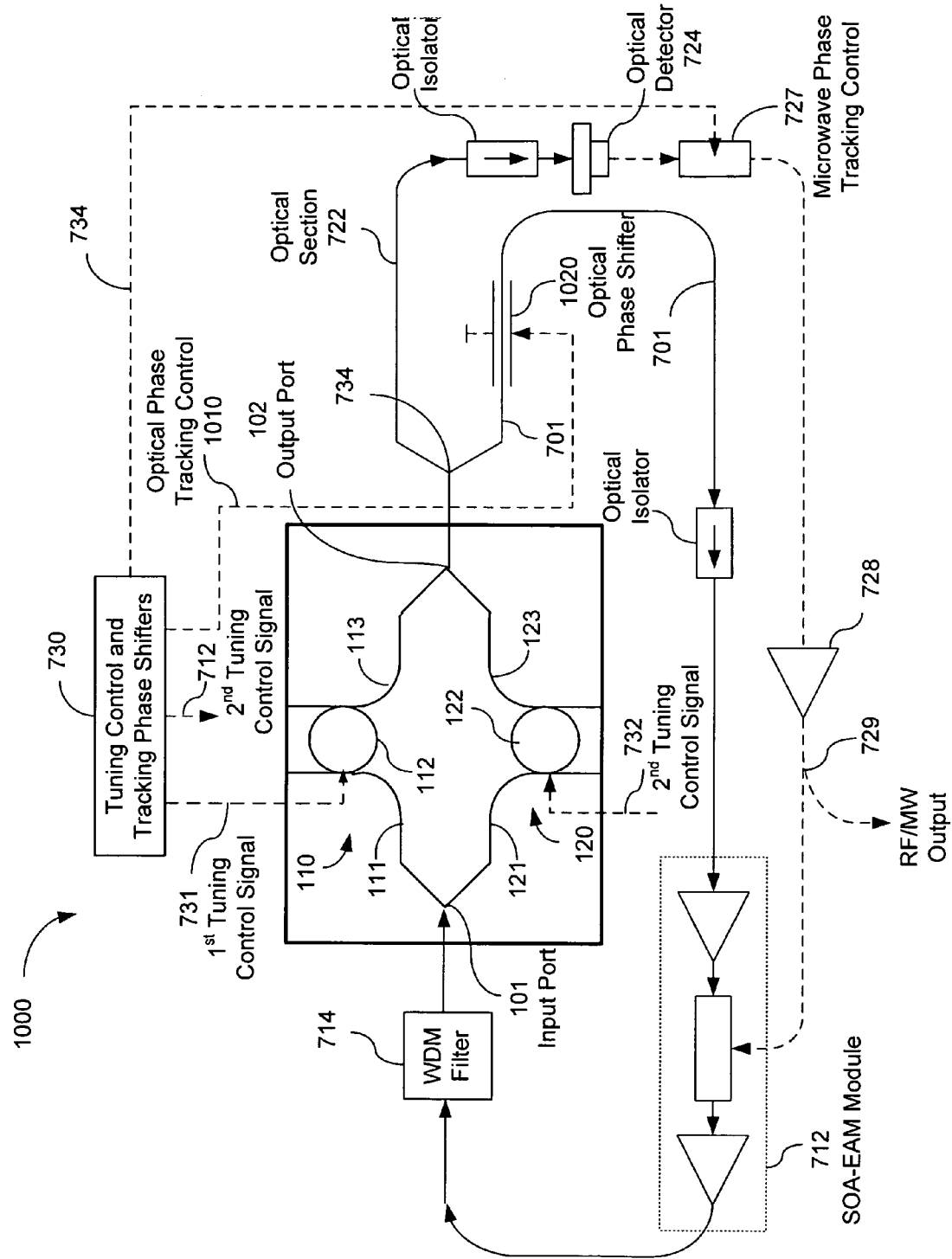

CONTINUOUSLY TUNABLE COUPLED OPTO-ELECTRONIC OSCILLATORS HAVING BALANCED OPTO-ELECTRONIC FILTERS

This application claims the benefit of and is a continuation-in-part application of U.S. patent application Ser. No. 10/963,755 entitled "TUNABLE BALANCED OPTO-ELECTRONIC FILTERS AND APPLICATIONS IN OPTO-ELECTRONIC OSCILLATORS" and filed Oct. 12, 2004 which claims the benefit of U.S. Provisional Patent Application No. 60/511,431 entitled "BALANCED OPTO-ELECTRONIC FILTER FOR TUNABLE OPTO-ELECTRONIC OSCILLATOR" and filed Oct. 15, 2003.

In addition, this application claims the benefits of U.S. Provisional Patent Application Nos. 60/525,992 entitled "CONTINUOUSLY TUNABLE AGILE COUPLED OPTO-ELECTRONIC OSCILLATOR WITH BALANCED LITHIUM NIOBATE OPTICAL FILTER AND FAST TRACKING PHASE SHIFTERS" and filed on Dec. 1, 2003, and 60/599,198 entitled "TUNING ALGORITHM FOR TUNABLE OEOS" and filed on Aug. 5, 2004.

The entire disclosures of the above-referenced four patent applications are incorporated herein by reference as part of the specification of this application.

BACKGROUND

This application relates to optical and photonic devices for various applications, such as optical, radio frequency (RF), and microwave applications.

Optical devices may be used to manipulate or control light for applications where signals are not in the optical frequencies. As an example, RF and microwave oscillators for generating signals in the RF and microwave frequencies may be constructed as "hybrid" devices by using both electronic and optical components to form opto-electronic oscillators ("OEOs"). See, e.g., U.S. Pat. Nos. 5,723,856, 5,777,778, 5,929,430, and 6,567,436. Such an OEO includes an electrically controllable optical modulator and at least one active opto-electronic feedback loop that comprises an optical part and an electrical part interconnected by a photodetector. The opto-electronic feedback loop receives the modulated optical output from the modulator and converted it into an electrical signal to control the modulator. The feedback loop produces a desired long delay in the optical part of the loop to suppress phase noise and feeds the converted electrical signal in phase to the modulator to generate and sustain both optical modulation and electrical oscillation in RF or microwave frequencies when the total loop gain of the active opto-electronic loop and any other additional feedback loops exceeds the total loss. The generated oscillating signals are tunable in frequency and can have narrow spectral linewidths and low phase noise in comparison with the signals produced by other RF and microwaves oscillators.

Coupled opto-electronic oscillators ("COEOs") are special OEOs that include both a laser optical loop to produce laser light and an opto-electronic loop that produces an electrical oscillation at a frequency much lower than the optical frequencies, such as a microwave or RF frequency. The laser oscillation in the optical loop is directly coupled to the electrical oscillation in an opto-electronic feedback loop. The laser oscillation and the electrical oscillation are correlated with each other so that both the modes and stability of one oscillation are coupled with those of the other oscillation. U.S. Pat. Nos. 5,929,430, and 6,567,436 describe various implementations of COEOs and are incorporated herein by reference as part of the specification of this application. Like other OEOs, a COEO is tunable in frequency to produce a tunable electrical oscillation in, e.g., RF or microwave frequencies.

The optical loop in a COEO supports different optical modes and the laser oscillation occurs in one or more optical modes. When the COEO is tuned in frequency, the laser oscillation may hop from one optical mode to another of the optical loop. Such mode hopping in the optical loop creates a discontinuity in frequency in tuning and is undesirable in various applications that require continuous frequency tuning.

SUMMARY

This application describes, among others, continuously tunable COEOs without optical mode hopping in the optical loop by using a tunable filter with two tunable optical resonators as passband filters to filter light in two parallel optical paths in the optical loop of the COEO. The resonant frequencies of the two optical resonators are offset from each other by the frequency of the desired electrical oscillation in, e.g., the RF or microwave spectral range. This tunable filter performs signal filtering and tuning of RF and microwave signal in the optical domain. The two parallel optical paths with the two optical resonators in the tunable filter effectuates two optical loops in the COEO that lase at the resonator frequencies of the two resonators, respectively. The optical phase difference of the two optical loops and the phase of the feedback of the opto-electronic loop are adjusted simultaneously to avoid optical mode hopping and to maintain the phase-matching in the opto-electronic loop in tuning the frequency of the electrical oscillation.

The tunable filter with the two optical resonators may be implemented in various configurations. In one implementation, an optical carrier beam generated in the optical loop at an optical carrier frequency is split into a first beam and a second beam. The optical carrier beam is modulated to carry a plurality of signal bands at frequencies different from the optical carrier frequency. The first beam is directed through a first optical path to transmit only light at the optical carrier frequency. The second beam is directed through a second, separate optical path to transmit only light at a selected signal band. The transmitted light from the first and second optical paths are combined to produce an optical output; An optical detector is used to receive the optical output and to recover the selected signal band.

In another implementation, the tunable filter includes an input port to receive an input optical beam at an optical carrier frequency, a first optical path, and a second optical path. The first optical path is coupled to the input port to receive a first portion of the input optical signal and includes a first optical resonator locked in frequency to be resonant at the optical carrier frequency to transmit light at the optical carrier frequency through the first optical path. The second optical path is coupled to the input port to receive a second portion of the input optical signal and includes a second optical resonator, which is tunable to be in resonance with light at a selected optical frequency different from the optical carrier frequency, to transmit light at the selected optical frequency through the second optical path. This device also includes an output port coupled to the first and second optical paths to combine transmitted light from the first and second optical paths to produce an output optical beam, and an optical detector to convert the output optical beam into a detector output carrying a signal at a frequency that is a difference between the optical carrier frequency and the selected optical frequency.

A device based on the above tunable filter may further include an optical modulator located to modulate light before the light enters the second optical resonator in response to a modulation control signal to produce a modulated optical beam at least part of which is directed into the second optical resonator. The optical modulator may be located to modulate light prior to entry of the input port or located in the second optical path between the input port and the second optical resonator. A feedback unit may be provided to supply the modulation control signal to form an opto-electronic oscillator.

This application describes another device which includes equal first and second optical paths that respectively include first and second optical resonators. The two optical paths split an input optical beam into a first optical beam into the first optical path and a second optical beam into the second optical path, and to combine light from the first and second optical paths as an optical output. The first optical resonator is coupled in the first optical path and locked to an optical carrier frequency of the input optical beam. The second optical resonator is coupled in the second optical path and is configured to exhibit an electro-optic effect and tunable in response to an electrical tuning signal to change a spectral difference of a resonance in the second optical resonator closest to the optical carrier frequency.

This application further describes a device that includes an input port to receive an input optical beam at an optical carrier frequency, a first optical path coupled to the input port to receive a first portion of the input optical signal and comprising a first optical resonator at a first resonance frequency to transmit light at the first resonance frequency through the first optical path, and a second optical path coupled to the input port to receive a second portion of the input optical signal and comprising a second optical resonator. The second optical resonator is tunable to be in resonance with light at a second resonance frequency different from the first resonance frequency and to transmit light at the second resonance frequency through the second optical path. An output port is coupled to the first and second optical paths to combine transmitted light from the first and second optical paths to produce an output optical beam.

Yet another device described includes means for splitting an optical carrier beam at an optical carrier frequency into a first beam and a second beam, means for modulating at least the second beam to carry a plurality of signal bands at frequencies different from the optical carrier frequency, means for directing the first beam through a first optical path to transmit only light at the optical carrier frequency, means for directing the second beam through a second, separate optical path to transmit only light at a selected signal band, means for combining transmitted light from the first and second optical paths to produce an optical output, and means for converting the optical output into an electrical signal to recover the selected signal band.

Examples of continuously tunable coupled OEOs are described. In one implementation, the device includes a closed optical loop to produce laser light, where the the closed is optical loop includes an optical gain medium to amplify light and to modulate an optical gain of the laser light in response to a control signal applied to the optical gain medium. An opto-electronic path is also included to comprise an optical section coupled to receive a portion of the laser light from the closed optical loop, an electronic section to produce the control signal, and an optical detector coupled between and interconnecting the optical section and the electronic section to covert light in the optical section into an electrical signal in the electronic section. The electronic section produces the control signal from the electrical signal and wherein the opto-electronic path and at least a portion of the closed optical loop form a closed opto-electronic loop to produce an oscillation at a signal frequency. The device also includes a tunable optical filter optically coupled in the closed optical loop to filter the laser light circulating in the closed optical loop. This tunable optical filter includes an input port to receive the laser light, a first optical path coupled to the input port to receive a first portion of the received laser light and comprising a first tunable optical resonator to transmit light at a first resonator resonance frequency, a second optical path coupled to the input port to receive a second portion of the laser light and comprising a second tunable optical resonator to transmit light at a second resonator resonance frequency different from the first resonator resonance frequency by the signal frequency, and an output port coupled to the first and second optical paths to combine transmitted light from the first and second optical paths to produce an output optical beam into the closed optical loop. The device further includes a mechanism to adjust a relative optical phase between the first and the second optical paths in response to a change in the signal frequency.

Another example of a continuously tunable coupled OEO includes the following components:

a laser to lase at first and second laser frequencies that differ by a signal frequency, the laser comprising a closed optical loop which comprises: an optical gain medium to produce an optical gain and to amplify light and to modulate the optical gain in response to a control signal applied to the optical gain medium, a common optical path having a first end and a second end, a first optical path coupled between the first end and second ends to receive a first portion of light in the closed optical loop and comprising a first optical resonator to transmit light at the first laser frequency, wherein the first optical resonator is tunable to change the first laser frequency, and a second optical path, parallel to the first optical path, coupled between the first end and second ends to receive a second portion of light in the closed optical loop and comprising a second optical resonator to transmit light at the second laser frequency, wherein the second optical resonator is tunable to change the second laser frequency;

an opto-electronic feedback path comprising an optical section coupled to the laser to receive a portion of light from the closed optical loop, an electronic section to produce the control signal and coupled to the optical gain medium to apply the control signal, and an optical detector coupled between the optical section and the electronic section to covert light in the optical section into an electrical signal in the electronic section, wherein the electronic section produces the control signal from the electrical signal and sustains an oscillation at the signal frequency in the opto-electronic path and at least a portion of the closed optical loop; and a tuning control mechanism to simultaneously control a relative optical phase between the first and the second optical paths, the first and the second optical resonators, and a phase of the control signal to continuously tune the signal frequency.

These and other implementations and their applications are described in greater detail in the attached drawings, the following detailed description, and the claims.

BRIEF DESCRIPTION OF DRAWINGS

FIGS. 8A, 8B, 8C, and 8D show simulated transmission response of the device in FIG. 7.

FIGS. 9A and 9B show analog and digital circuits for applying the control voltages in the tuning controller of the device in FIG. 7.

FIG. 10 shows another example of a continuously tunable coupled opto-electronic oscillator with simultaneous optical and RF phase compensation.

DETAILED DESCRIPTION

Figure 1:
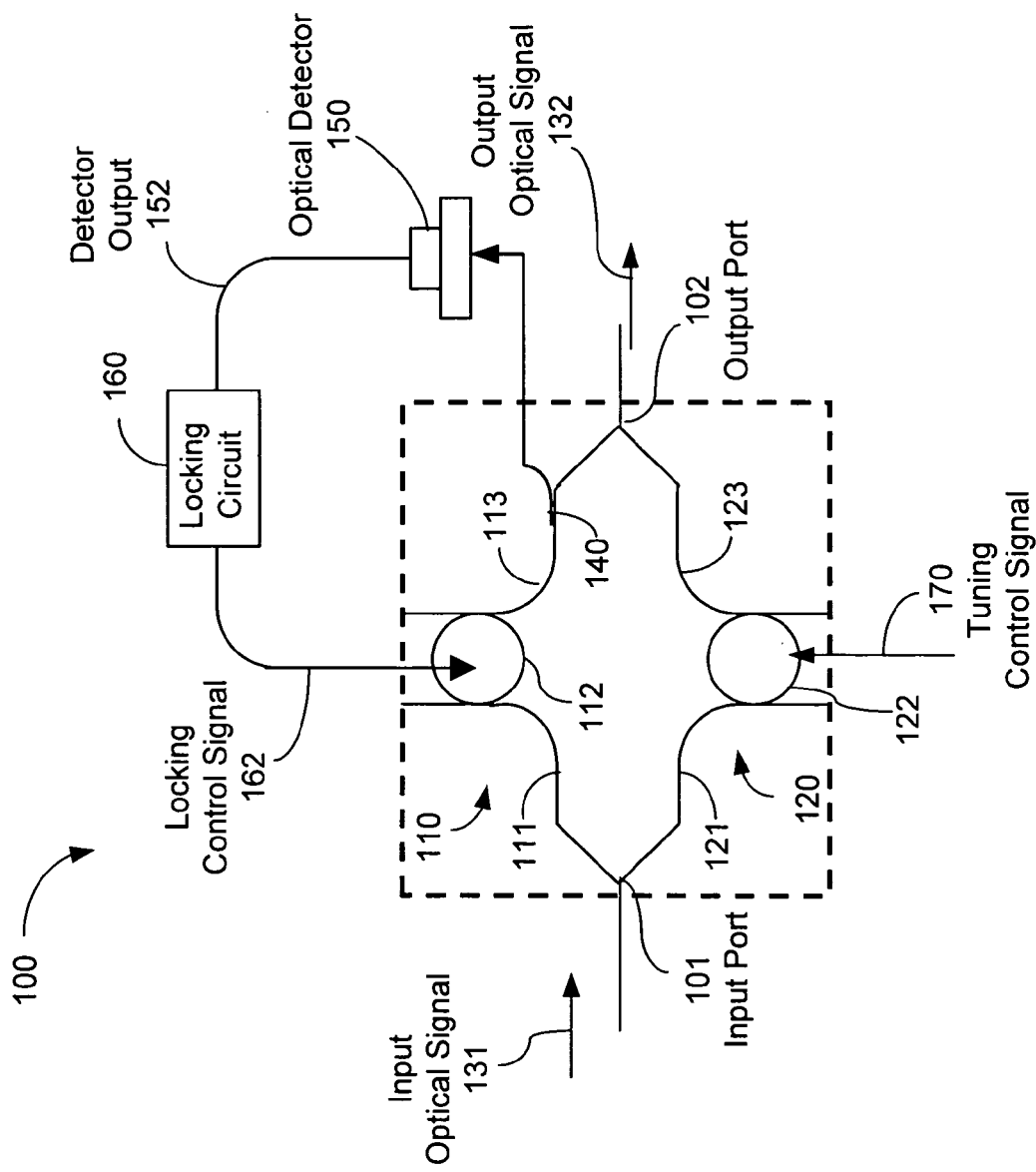
FIG. 1 shows an example of a tunable RF or microwave filter based on optical filtering with two optical resonators.

Various implementations of continuously tunable COEOs described in this application use tunable filters that perform signal filtering in RF or microwave frequencies by optical filtering in two optical resonators. Examples of such tunable filters are described in the U.S. patent application Ser. No. 10/963,755 entitled "TUNABLE BALANCED OPTO-ELECTRONIC FILTERS AND APPLICATIONS IN OPTO-ELECTRONIC OSCILLATORS." The following sections first describe the tunable filters and then continuously tunable COEOS that use such tunable filters.

The tunable filters used in the COEOs in this application use two optical resonators as passband filters to filter light in two optical paths to effectuate a tunable filter. In implementation, such devices may use an input port to receive an input optical beam, a first optical path coupled to the input port to receive a first portion of the input optical signal, and a second optical path coupled to the input port to receive a second portion of the input optical signal. The first optical path has a first optical resonator at a first resonance frequency to transmit light at the first resonance frequency through the first optical path. The second optical path has a second optical resonator, which is tunable to be in resonance with light at a second resonance frequency different from the first resonance frequency, to transmit light at the second resonance frequency through the second optical path. An output port is coupled to the first and second optical paths to combine transmitted light from the first and second optical paths to produce an output optical beam.

Therefore, the output optical beam in the output port must have two spectral components at the resonance frequencies of the first and second resonators. When an optical detector is used to receive the output optical beam, the beat signal of two spectral components in a photodetector is converted into RF signal at the beat frequency which is a difference between the first and second optical resonance frequencies. When the second optical resonator is tuned relative to the first optical resonator, the allowed beat frequency of the converted signal changes accordingly to provide a tunable filtering operation. The detuning between the first and second optical resonators may be in the RF or microwave frequencies by controlling the frequency difference between the resonators as an RF or microwave passband or notch filter. Different from conventional RF or microwave notch filters, the devices described here perform the filtering in the optical domain by filtering light carrying the RF or microwave signals through two optical resonators in order to effectuate filtering in the RF or microwave domain.

For example, an optical beam at an optical carrier frequency may be modulated to include sidebands to carry RF or microwave signals. The first optical resonator may be locked in frequency to the optical carrier frequency. The second optical resonator may be tuned to select a desired sideband to transmit to the output port while rejecting the optical components at the optical carrier frequency and other sidebands. At the optical detector, the RF or microwave signal in the selected sideband is detected due to the beating between the optical carrier selected by the first optical resonator and the sideband selected by the second optical resonator. The first and second optical resonators may be designed to have sufficiently narrow optical spectral linewidths to transmit only optical spectral components within a selected band while rejecting light from adjacent bands.

FIG. 1 shows a tunable filter 100A as one example of the devices described here. The filter 100A has an optical input port 101 to receive an input optical signal 131 and an optical output port 102 to export an output signal 132. The input port 101 is coupled to first and second optical paths 110 and 120, respectively, to split the input signal 131 into a first signal to the first optical path 110 and a second optical signal to the second optical path 120. The two optical paths 110 and 120 are combined at the output port 102. In the examples described here, the fist and second optical paths 110 and 120 have equal optical path lengths but different optical spectral transmission properties.

The first optical path 110 as illustrated includes optical path 111, a first optical resonator 112, and a second optical path 113 optically connected in series. The optical paths 111 and 113 may be waveguides such as waveguides formed on a substrate or fibers. The first optical resonator 112 is optically connected between the paths 111 and 113 to filter light from the path 111 and sends transmitted light to the path 113. As illustrated, the optical resonator 112 may be a ring resonator, a whispering gallery mode sphere resonator, or a whispering gallery mode disk resonator. The coupling between the resonator 112 and the paths 111 and 113 may be evanescent coupling. The second optical path 120 is similarly constructed with a first optical path 121, a second optical resonator 122, and a second optical path 123 optically connected in series between the input port 101 and the output port 102. To a certain extent, the general optical layout of this two-path design resembles a typical optical Mach-Zehnder interferometer which operates by splitting an optical beam into two optical paths and then combining the light from the two optical paths together to interfere. The presence of the first and second optical resonators 112 and 122, however, makes the filter 110A very different from Mach-Zehnder interferometers in device structure, device operation, and device function.

The first optical resonator 112 may be a tunable resonator and the first resonance frequency is controlled or stabilized at a desired reference frequency. The second optical resonator 122 is then tuned relative to the first resonance frequency to select a sideband carried the input signal 131. In many applications, the first resonance frequency is locked to the optical carrier frequency in the input signal 131 by, for example, dynamically adjusting the first optical resonator to reduce any deviation in frequency from the optical carrier frequency.

FIG. 1 shows a feedback locking circuit 160 for such dynamic control of the first resonator 112. An optical coupler 140 is used to tap a fraction of light transmitted through the first optical resonator 112 in the path 113. An optical detector 150 is used to convert the received light into a detector output 152. The locking circuit 160 produces a locking control signal 162 in response to the detector output 152 to adjust the resonance frequency of the resonator 112. The resonator 112 may be tunable by a suitably tuning mechanism, e.g., by thermal control of the resonator whose index, dimension, or both change with temperature, mechanical control of the resonator by changing the dimension of the resonator, electrical control, or optical control. More specifically, an electro-optic material may be used in the resonator 122 to control and tune the resonance frequency by an external control signal. The resonator 112 may be a tunable WGM resonator. Similarly, the resonator 122 in the second optical path 120 may also be tuned by any of the tuning methods described above. To tune the filter 100A, an external tuning control signal 170 is applied to the resonator 122 to tune the frequency spacing between the first and second resonance frequencies.

For example, both resonators 112 and 122 may be tunable electro-optic resonators. Under this implementation, the filter 100A is an electro-optically tunable filter to serve as side-band frequency selective element in photonic RF or microwave systems. An Opto-Electronic Oscillator (OEO) may include one electro-optic filter based on high-Q lithium niobate (LN) resonators in the configuration in FIG. 1. In one implementation of the design in FIG. 1, an electro-optically tunable photonic RF filter is based on the balanced operation of two identical Electro-Optical (EO) resonators 112 and 122 serving as optical filter elements in equal arms 110 and 120 of a Mach-Zender interferometer. The free spectral range (FSR) of the resonators 112 and 122 is chosen to exceed the doubled maximum operational frequency of the filter. As an example, the FSR of each resonator should be 30 GHz for stable operation of the filter in a tuning range of 0–15 GHz. One of the arms of the interferometer has a tapping coupler that allows to lock the resonator 112 in the corresponding arm by adjusting the DC voltage applied to the resonator 112 so as to maintain constant transmission of the laser power at its frequency serving as eventual optical carrier frequency for operation of the photonic filter or OEO. A second DC control voltage can be applied to the second resonator 122 to change the relative position of its closest optical resonance with respect to the optical carrier, and thereby define the operational frequency of the photonic filter or OEO. This voltage will also track the variations of the locking DC voltage of the carrier-stabilized OE resonator 112. Because one of the resonators 112 and 122, i.e., the resonator 112 in the illustrated examples, is locked to track the frequency of the input laser, the tuning control voltage on the second filter 122 is corrected correspondingly to maintain the desired frequency offset which is the target RF frequency of the sideband filtering. For example, if the electrical sensitivities of the two tunable resonators 112 and 122 are equal, the tuning control voltage 170 applied to the resonator 122 can be the sum of an external proportional regulation voltage and a copy of the locking control signal 162 where the copy of the signal 162 sets the resonator 122 at the same resonance of the resonator 112 in tracking the input laser frequency while the external regulation voltage provides the detuning in the resonator 122 from the resonance of the resonator 112 to target a desired RF or WM frequency to filter. A separate control circuit is used to generate this control voltage 170. Both signals from the two optical arms recombine at the output port 102 with an equal phase after the Mach-Zender interferometer, and can then be detected for the filtering operation, or delayed and detected for the subsequent feedback into an optical modulator in an opto-electronic oscillator. This balanced design may be used to achieve two main goals among other operation features and advantages. First, the discriminated phase noise of the laser that would otherwise be observed at the detector after the filter can be minimized or canceled as the parasitic amplitude modulation. Second, the relative thermal detuning between the two resonators 112 and 122 can be minimized by placing both resonators 112 and 122 on a relatively massive common substrate with a very high thermal conductivity.

Figure 2:
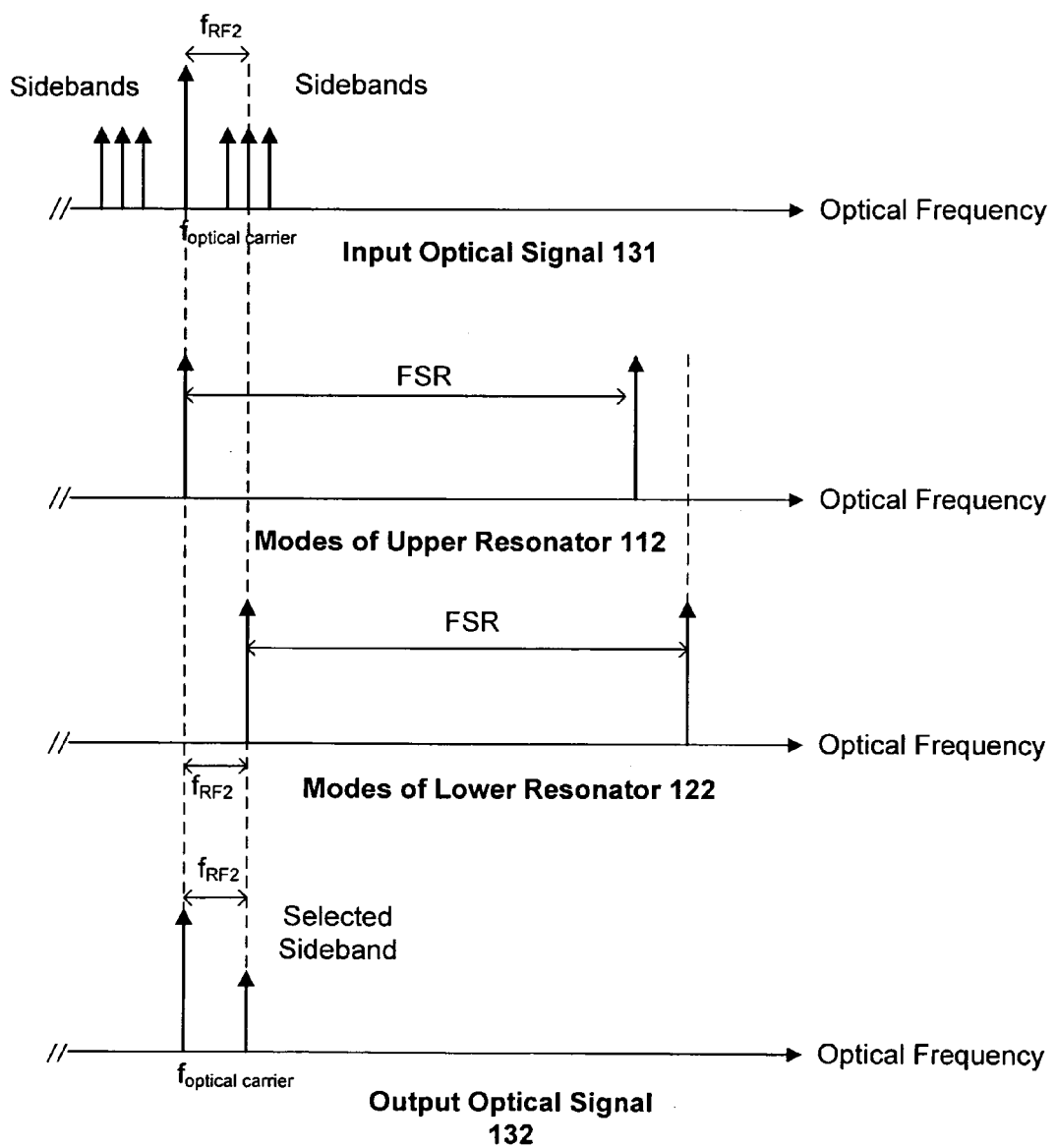
FIG. 2 illustrate the operation of the tunable filters in FIG. 1.

FIG. 2 illustrates the operation of the filter 100 in FIG. 1. Assume the input signal 131 has multiple sidebands that carry information on a beam at an optical carrier frequency. The resonator 112 is tuned so that one resonance peak is at the optical carrier frequency. The light at the optical carrier frequency is selected by the resonator 112 to transmit and the sidebands at other frequencies are rejected. The resonator 122 is detuned by a desired RF or microwave frequency from the resonance frequency of the resonator 112 to select one sideband to transmit while rejecting other sidebands and the optical carrier. Thus, the optical output 132 has both the optical carrier and the selected sideband. When the output 132 is detected by an optical detector, the sideband at the RF or microwave frequency is recovered. The FSR of the resonators 112 and 122 is designed according to the desired continuous tuning range of the filter and is at least twice of the tuning range.

Figure 3:
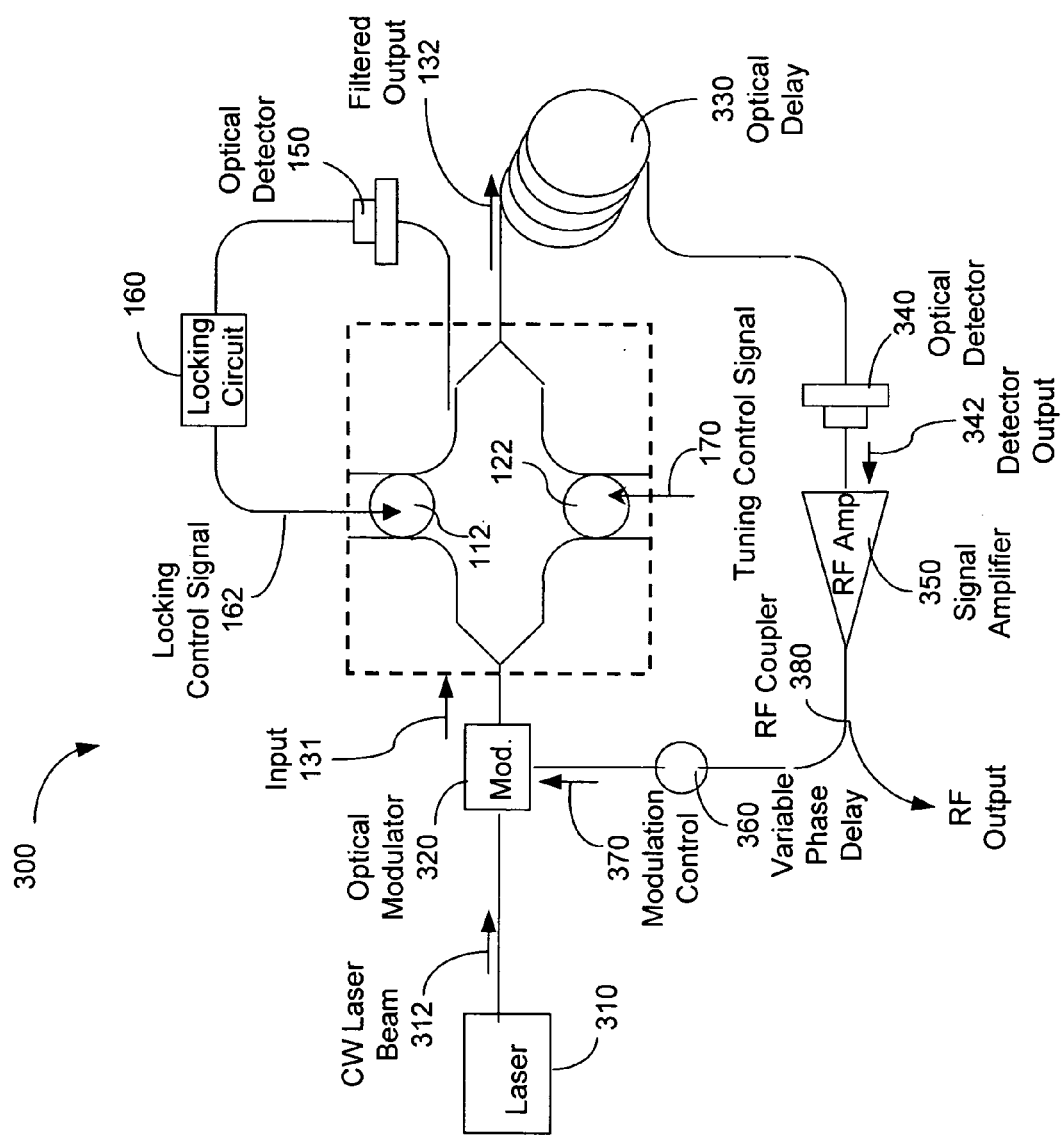
FIG. 3 shows a tunable opto-electronic oscillator that uses a tunable filter described in this application.

The above tunable filters may be used in opto-electronic oscillators. FIG. 3 shows one OEO 300 where an optical modulator 320 receives and responds to a modulation control signal 370 to modulate a CW beam 312 from a light source 310 such as a laser. This optical modulation produces an input beam 131. Next to the optical modulator 320 is the tunable optical filter shown in FIG. 1. The optical output 132 of the filter is directed into an optical delay element 330, which may be, e.g., a fiber delay line or an optical resonator, to produce a desired long delay to suppress noise in the oscillator 300. When the optical delay 330 is an optical resonator, certain phase matching conditions must be met. See, e.g., U.S. Pat. No. 6,567,436, the entire disclosure of which is incorporated herein by reference. An optical detector 340 is used to receive the optical output from the optical delay 330 and produces a detector output 342. This detector 340 is an interface from the optical portion of the OEO 300 to an electrical portion that connects between the optical modulator 320 and the detector 340. The detector output 342 is conditioned in the electrical portion to produce the modulation control signal 370 for the optical modulator 320. In the illustrated example, the electrical portion includes a signal amplifier 350 (e.g., an RF amplifier) and a variable phase delay 360. Hence, the opto-electronic feedback loop in the OEO 300 includes the optical modulator 320 as the interface from the electrical portion to the optical portion, the tunable filter, the optical delay 330, and the optical detector 340. The total loop gain is greater than the losses and the feedback is in phase so that an oscillation at the frequency determined by the difference between the first and second resonance frequencies of the resonators 112 and 122 can be sustained. The energy of the oscillation is obtained from the light source 310 and the amplifier 350. The oscillating signal from the OEO 300 is tunable in frequency by tuning the resonator 122. The optical signal in the OEO 300 can be tapped at any location in the optical section of the feedback loop to produce an optical output. Similarly, the electrical oscillation signal in the electrical portion of the feedback loop may be tapped to produce an RF or microwave output, e.g., by using a signal coupler 380 at the output of the amplifier 350.

Figure 4:
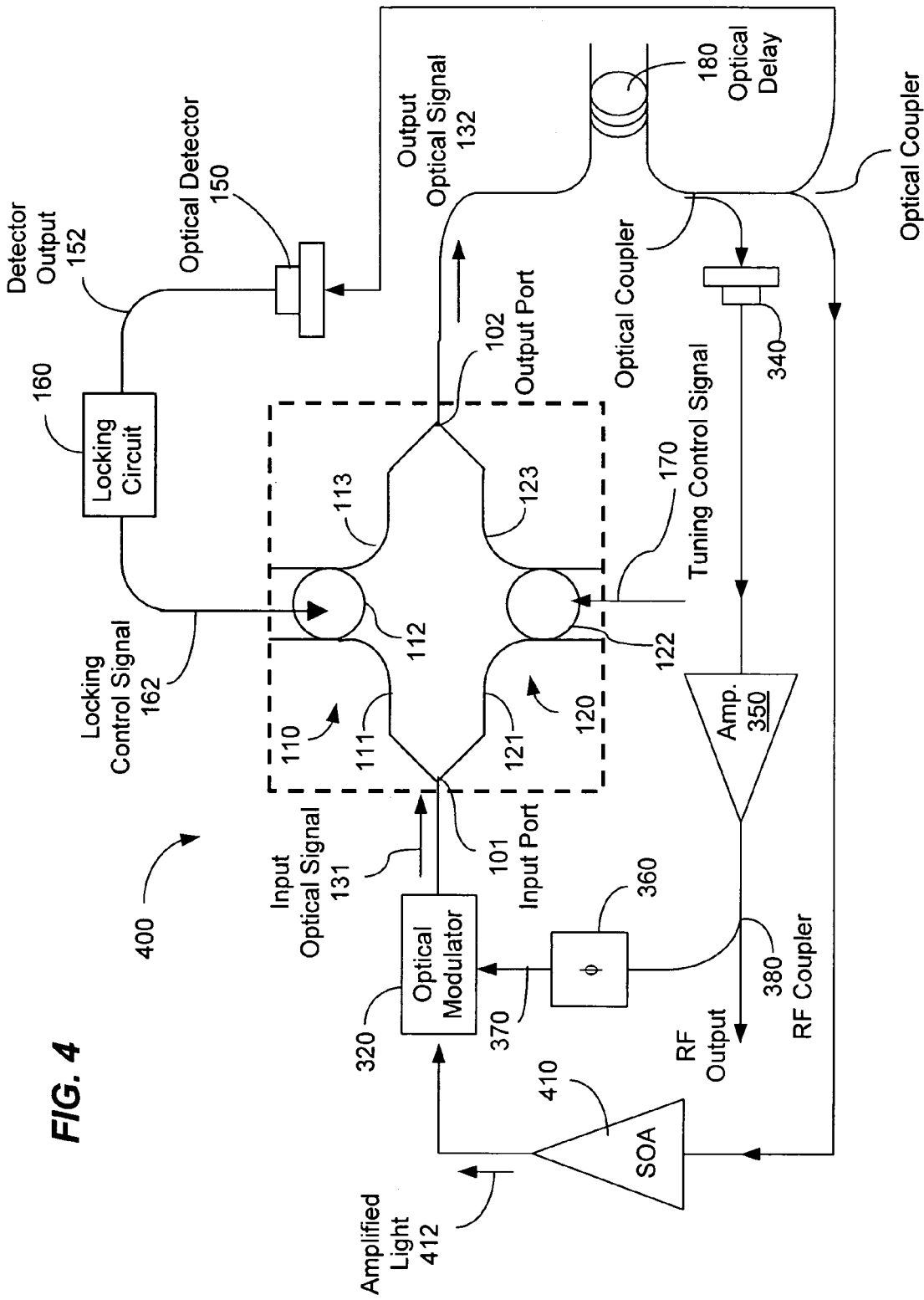
FIG. 4 shows a tunable coupled opto-electronic oscillator that uses a tunable filter described in this application.

FIG. 4 shows an example of a coupled OEO 400 that uses the tunable filter in FIG. 1. Referring to U.S. Pat. Nos. 5,929,430, and 6,567,436, a COEO directly couples a laser oscillation in an optical feedback loop to an electrical oscillation in an opto-electronic feedback loop. The laser oscillation and the electrical oscillation are correlated with each other so that both the modes and stability of one oscillation are coupled with those of the other oscillation.

In the specific example shown in FIG. 4, the optical feedback loop forms a ring laser cavity and includes the optical modulator 320, the tunable filter 100 in FIG. 1, and an optical gain medium 410, e.g., a semiconductor optical amplifier (SOA). The optical gain medium 410 amplifies the output light from the optical delay element 180 to produce the amplified light 412 as the input to the optical modulator. The optical gain from the gain medium 410 is greater than the optical losses in the loop to effectuate the laser oscillation. The opto-electronic loop in the COEO 400 includes the optical modulator 320, the tunable filter 100 in FIG. 1, the optical delay 180, the optical detector 340, and the electrical portion of the feedback (e.g., the amplifier 350 and the variable phase delay 360). The two loops are share the optical modulator 320, the tunable filter, and the optical delay 180. The open loop gain in the opto-electronic loop also exceeds the loss to sustain the electrical oscillation. The coupling between two feedback loops is achieved at the optical modulator 320 which modulates the gain in the optical loop by the modulation control signal generated by the opto-electronic feedback loop.

Figure 5:
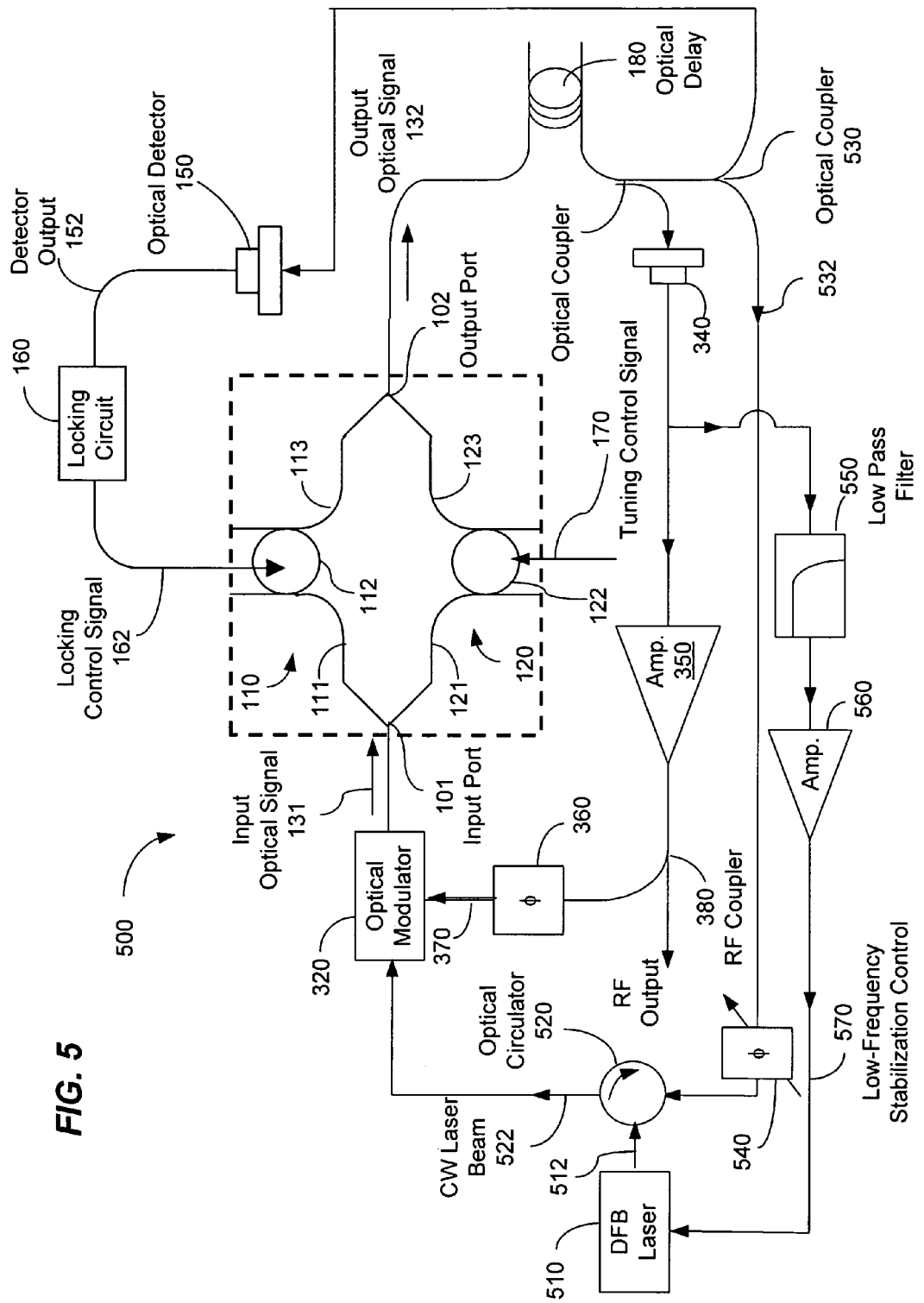
FIG. 5 shows a tunable opto-electronic oscillator that uses a tunable filter described in this application and a self-injection mechanism to stabilize the laser source.

FIG. 5 shows another example of an OEO 500 that further uses optical self injection to stabilize a laser 510 that produces the CW light supplied to the opto-electronic loop. The OEO 500 uses a tunable laser, such as a distributed feedback (DFB) semiconductor laser, as the laser 510 to produce the CW laser beam 522. The laser 510 has an output optical port 512 that exports the laser beam 522. In self injection locking, an external optical beam is injected back into the laser cavity via the output optical port 512 to stabilize the laser. In OEO 500, the optical signal in the optical section of the opto-electronic feedback loop is injected back to the laser 510 via the port 512 to stabilize the laser 510. An optical circulator 520 or another other suitable optical routing device may be used to direct the output beam 522 to the optical modulator 320 of the OEO 500 and to direct a portion of the optical signal in the OE loop to the laser 510. As illustrated, an optical coupler 530 is used to split a portion of the optical output from the optical delay 180 to produce the feedback optical signal 532. The optical circulator 520 directs the signal 532 into the laser 510. An optional variable optical phase delay 540 may be placed in the optical path of the optical feedback signal 532 to adjust the phase of the signal 532 for injection locking in the laser 510.

The laser 510 may exhibit low frequency drafts in its power and frequency due to various factors such as a change in temperature in the laser cavity. Such a drift may cause the laser 510 out of the locking condition by the optical injection. A low-frequency stabilization control mechanism, hence, may be provided to mitigate such drifts and to maintain the laser 510 locked in frequency. As illustrated, a portion of the detector output from the detector 340 in the electrical portion of the opto-electronic feedback may be processed to extract the low frequency component of the signal as a feedback signal to control the laser 510 so that the laser is adjusted to compensate for the drift. A low pass filter 550 may be used to filter the signal from the detector 340 where high frequency components are removed. Next, a signal amplifier 560 is used to amplify the filtered signal to produce the final feedback control signal 570 to the laser 510. As an example, this signal 570 is used to control the driving current to a DFB semiconductor laser used as the laser 510.

The above examples of OEO devices using the tunable filters described here use the opto-electronic feedback loop as the sole feedback loop to control the oscillation. One or more additional feedback loops may be used to control the optical modulator in the opto-electronic feedback loop to form multi-loop OEOs with the above tunable filters. Various multi-loop OEOs are described in U.S. Pat. No. 5,777,778 which is incorporated herein by reference. In a multi-loop OEO, the different feedback loops have different delays. The opto-electronic feedback loop with the longest delay is used to achieve low phase noise and narrow spectral linewidth. This loop is also used to provide fine frequency tuning since its mode spacing is smaller than any of the other feedback loops. On the other hand, the feedback loop with the shortest delay and the widest mode spacing, either opto-electronic or purely electronic, is used to provide a coarse frequency tuning to achieve a wide continuous tuning range. The total open loop gain of the multiple loops must exceed the total losses to sustain an opto-electronic oscillation but each loop may have an open loop gain less than the loss in that loop.

The optical delay element 330 in FIG. 3 or 180 in FIGS. 4 and 5 may be an optical resonator with a high quality factor and a low optical loss. A fiber ring cavity or a fiber Fabry-Perot cavity, for example, may be used as the optical delay 330 or 180. In one specific implementation, the delay element 330 or 180 may be a fiber cavity formed from a 20-meter fiber to have a free spectral range of about 10 MHz and a finesse of about 125. The optical coupling for the optical delay element 330 or 180 may be weak to maintain the high quality factor of the cavity.

The optical modulator 320 in the above described devices may be alternatively placed in the lower optical path 121 between the input port 101 and the tunable resonator 122. For example, the devices shown in FIGS. 4 and 5 may use this configuration.

In the above devices, the tunable resonators 112 and 122 may be implemented in various configurations, including ring resonators and whispering gallery mode (WGM) resonators. A suitable ring resonator may be formed in waveguide rings like fiber rings. A WGM resonator may be implemented in a number of configurations, including, microsphere WGM resonators, microdisk WGM resonators with spherical and non-spherical exterior surfaces, and microring WGM resonators with spherical and non-spherical exterior surfaces. The non-spherical exterior surfaces may be spheriodal surfaces of spheroids or conic surfaces. See, e.g., U.S. Pat. No. 6,795,481, the entire disclosure of which is incorporated herein by reference as part of the specification of this application.

A tunable resonator suitable for the above devices and their variations may be implemented in various configurations. When a tunable WGM resonator is used, for example, the tuning may be achieved by thermal control of the resonator whose index, dimension, or both change with temperature, mechanical control of the resonator by changing the dimension of the resonator, electrical control, or optical control. Electro-optic materials may be used to control and tune the resonance frequency of the WGM resonator by an external control signal.

Figure 6A:
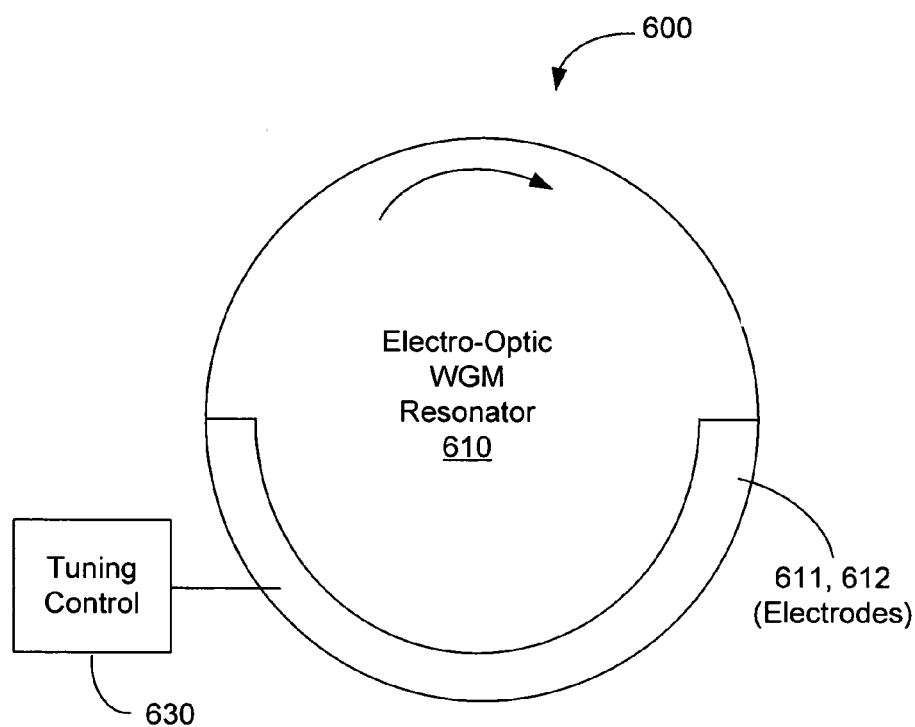
FIGS. 6A and 6B illustrate an example of a tunable whispering gallery mode optical resonator based on an electro-optic effect.
Figure 6B:
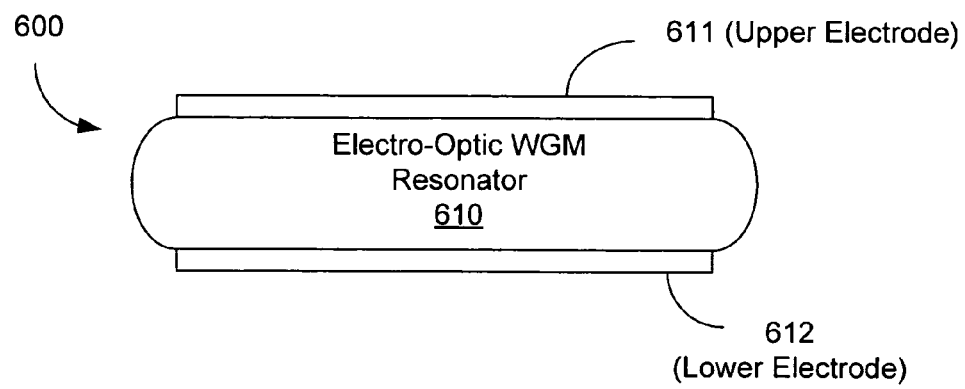

FIGS. 6A and 6B show an example of a tunable electro-optic WGM resonator 600 having a WGM resonator 610. The electro-optic material for the entire or part of the resonator 610 may be any suitable material, including an electro-optic crystal such as Lithium Niobate ("Lithium Niobate resonator") and semiconductor multiple quantum well structures. One or more electrodes 611 and 612 may be formed on the resonator 610 to apply a control electrical field in at least the region where the WG modes are present to control the index of the electro-optical material and to change the filter function of the resonator. Assuming the resonator 610 has disk or ring geometry, the electrode 611 may be formed on the top of the resonator 610 and the electrode 512 may be formed on the bottom of the resonator 610 as illustrated in the side view of the device in FIG. 6B. In one implementation, the electrodes 611 and 612 may constitute an RF or microwave resonator to apply the RF or microwave signal to co-propagate along with the desired optical WG mode. For example, the electrodes 611 and 612 may be microstrip line electrodes. The electrodes 611 and 612 may also form an electrical waveguide to direct the electrical control signal to propagate along the paths of the WG modes. A tuning control unit 630 such as a control circuit may be used to supply the electrical control signal to the electrodes 611 and 612.

In operating the tunable resonator 600, the control unit 630 may supply a voltage as the electrical control signal to the electrodes 611 and 612. The control voltage may be a DC voltage to set the resonance peak of the resonator 600 at a desired spectral location. The DC voltage may be adjusted by the control unit 630 to tune the spectral position of the transmission peak when such tuning is needed. For dynamic tuning operations, the control unit 630 adjusts the control voltage in response to a control signal to, e.g., maintain the transmission peak at a desired spectral position or frequency or to change the frequency of the transmission peak to a target position. In some other operations, the control unit 630 may adjust the control voltage in a time varying manner, e.g., scanning the transmission peak at a fixed or varying speed or constantly changing the transmission peak in a predetermined manner.

For example, a Z-cut $LiNbO_3$ disk cavity with a diameter of d=4.8 mm and a thickness of 170 μm may be used as the resonator 610. The cavity perimeter edge may be prepared in the toroidal shape with a 100 μm radius of curvature. As an alternative to the strip electrodes shown in FIG. 6A, the top and bottom surfaces of the disk resonator may be coated with conductive layers for receiving the external electrical control signal. A metal such as indium may be used to form the conductive coatings. Tuning is achieved by applying and adjusting a voltage to the top and bottom conductive coatings. Each conductive coating may be absent in the central part of the resonator and are present at the perimeter edge of the resonator where WGMs are localized.

The tunable filters with two optical resonators described above may be used to build continuously tunable COEOs. Tunable opto-electronic oscillators are commonly characterized by the generation of high spectral purity microwave signals over a wide tuning range using optical delays. The low phase noise in OEOS can be achieved by long delay lines, e.g., using fiber optics, while the tunability is achieved with optical tunable filters and controllable optical and microwave phase shifters. The following sections describe coupled OEOs that use the above-described tunable filters to produce continuous coverage over the multi-octave wide tuning range. Primary tuning is achieved by changing the voltage applied to the lithium niobate resonators. The change in optical phase with frequency in connection with the frequency tuning can be compensated by simultaneous adjusting the relative optical phase between the two optical paths in the-tunable filter. In addition, the phase of the RF feedback (microwave control signal applied to the modulator in the closed optical loop that produces the laser light).

In one implementation, the tuning control may be implemented by a look-up table for the tuning ports settings, where discrete tuning will be achieved by changing voltage on lithium niobate filters, between specific frequencies with spacing defined by the free spectral range of the optical loop. The tuning between these specific frequencies is achieved by applying tuning voltages to optical and RF phase shifters in a linear fashion, i.e., the voltage change that is proportional to a frequency change. The required change in optical and microwave phases with frequency is achieved according to the pre-calibrated control values in the look-up table. The resulting tuning control results provides uninterrupted (mode-hop-free continuous frequency tuning of coupled tunable opto-electronic oscillators. The implementation can take a form with an analog or a digital tuning input signals.

Figure 7:
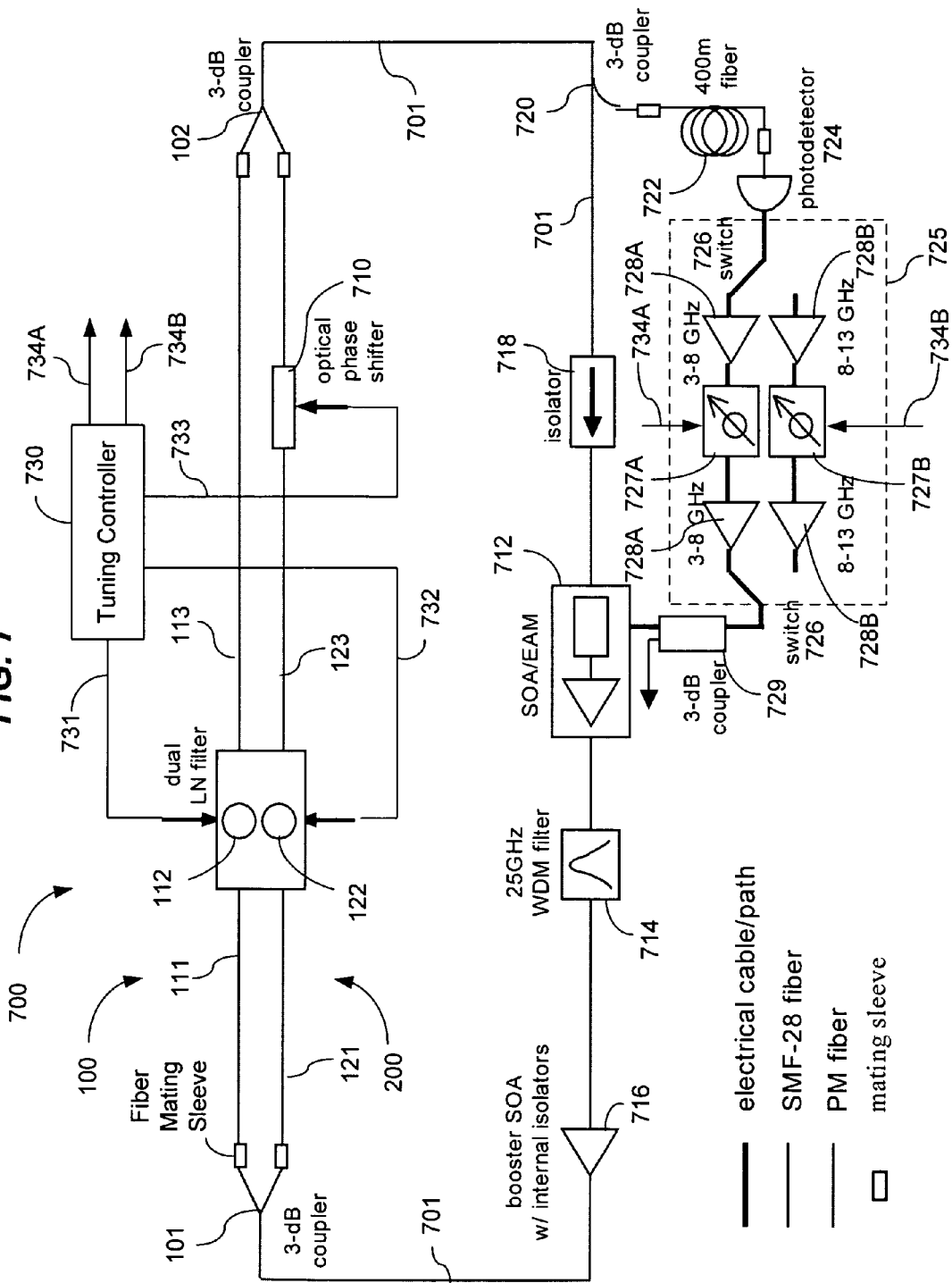
FIG. 7 shows one example of a continuously tunable coupled opto-electronic oscillator with simultaneous optical and RF phase compensation.

FIG. 7 illustrates an example of a continuously tunable COEO 700. The closed optical loop for generating the laser is formed by a common optical path 701 and a tunable optical filter as described above. The two ports 101 and 102 of the tunable optical filter are respectively coupled to the two end terminals of the common optical path 701 to form a closed loop. Optical fibers and other optical medium may be used to construct the common optical path 701. An optical isolator 718 may be used in the closed optical loop to ensure the laser light circulating in the loop in a single direction. In the common optical path 701, at least optical gain medium 712 is provided to produce the optical gain that is responsible for the laser oscillation in the closed optical loop. Additional optical gain sections such as one or more semiconductor optical amplifiers (SOAs) 716 may be used in the closed loop to produce a sufficient optical gain in the loop. The optical gain medium 712 may be controlled by a control signal to modulate the optical gain. As an example, the optical gain medium 712 may include a semiconductor optical amplifier (SOA) and an electro-optic absorption modulator (EAM).

The control signal applied to the optical gain medium 712, e.g., the EAM within the medium 712, is generated from an opto-electronic feedback path in the COEO 700. This opto-electronic feedback path is formed by an optical section 722, an optical detector 724, and an electrical section 725. The optical section 722 may be designed to produce a long optical delay to reduce the phase noise in the generated signal. For example, a long optical fiber loop, e.g., 400 meters, may be included in the optical section 722. An optical coupler 720 in the common optical path 701 is used to couple the optical section 722 to the closed optical loop. Hence, a portion of the laser light in the closed optical loop is coupled into the optical section 722 and is converted into an electrical signal by the optical detector 724 that is received by the electrical section 725. The electrical section 725 processes the signal to produce the control signal that is applied to the gain medium 712. The portion of the closed optical loop between the optical gain medium 712 and the optical coupler 720 and the opto-electric feedback path form a closed opto-electronic loop and sustain an oscillation at a signal frequency which may be in the RF or microwave spectral range. This closed opto-electronic loop is coupled with the closed optical loop that provides the laser oscillation. The optical paths in the COEO 700 may be implemented by various optical media such as single-mode fiber (SMF) or polarization-maintaining (PM) fibers.

The tunable filter has two parallel optical paths 110 and 120 with two resonators 112 and 122. Hence, the closed optical loop in fact has two separate loops, the first closed optical loop formed by the common optical path 701 and the first optical path 110 in the filter with the resonator 112 and the second closed optical loop formed by the common optical path 701 and the second optical path 120 in the filter with the resonator 122. These two optical loops lase at different laser frequencies set by the resonance frequencies of two resonators, respectively. Hence, the COEO 700 effectuates a feedback-regenerated biharmonic closed loop laser, in which simultaneous generation of two optical tones is maintained by the RF or microwave feedback via the opto-electronic feedback path.

The free spectral range (FSR) of optical modes of the two resonators 112 and 122 is much greater than the FSR of the optical modes of the closed optical loops. The two resonators 112 and 122 are tuned to two different resonator frequencies that overlap with modes of the closed optical loop and are offset by an amount equal to the signal frequency f0 generated in the opto-electronic loop. A optical bandpass filter 714, such as a WDM filter, is placed in the common optical path 701 to select two closest optical modes of separate resonators 112 and 122 falling within the transmission bandwidth of the filter 717. Continuous and uninterrupted (mode-hop-free) tuning is provided by simultaneous agile tracking of optical and microwave feedback phases synchronously with high-Q resonator tuning. The range of phase tracking is $2\pi$ times the ratio of total required tuning range for oscillator over the free spectral range of the corresponding (optical or microwave) feedback loop. The alignment of tracking is achieved by calibration of frequency and phase responses and subsequent conditioning of tuning and tracking voltages applied from the electronic driver or a tuning controller 730.

The tuning controller 730 controls the tuning of the two resonators 112 and 122 to set the signal frequency of the opto-electronic loop, the tuning of the relative optical phase between the two optical paths 110 and 120, and the tuning of the phase of the control signal to the optical gain medium 712 generated by the opto-electronic feedback path. In the COEO 700, an optical phase shifter 710 is inserted in the second optical path 120 to change the relative optical phase between the two paths 110 and 120 in response to a control signal 733 from the tuning controller 730. This control allows for continuous optical tuning without optical mode hopping. The optical phase shifter 710 may be implemented in various configurations, such as an electro-optical device to change the refractive index in a portion of the path 120 or a variable optical delay device to change the length of the optical path 120.

The controller 730 also produces control signals 731 and 732 to control and tune the resonators 112 and 122, respectively. As an example, the resonators 112 and 122 may be configured to exhibit electro-optic effects, such as lithium niobate resonators, and accordingly the controls signals 731 and 732 may be control voltages. The resonators 112 and 122 may be made tunable by other suitable mechanisms.

The electrical section 725 of the opto-electronic feedback path may include an RF or microwave phase shifter 7274A and one or more signal amplifiers 728A. The phase shifter 727A produces a variable phase shift in the control signal applied to the gain medium 712 in response to a phase control signal 734A. In practice RF or microwave amplifiers, the signal bandwidth is limited and hence two or more parallel electrical sections with different RF or microwave amplifiers at different signal spectral ranges may be used in order to accommodate for the wide tuning spectral range of the COEO 700. Accordingly, switches 726 may be used to select a suitable electrical section to operate according the-signal frequency range. As illustrated, two exemplary sections are shown to operate at frequencies from 3 to 8 GHz and from 8 to 13 GHz. Accordingly, two phase control signals 734A and 734B are generated by the tuning controller 730 to control the two different phase shifers 727A and 727B, respectively. An RF or microwave coupler 729 may be coupled between the optical gain medium 712 and the section 725 to provide an RF or microwave output from the COEO 700.

In operation, the COEO 700 is measured and calibrated to obtain corresponding control signal values for the controls signals 731, 732, 733, 734A, and 734B for a set of predetermined operating signal frequencies. These control signal values are stored in a look-up table in the tuning controller 730. The tuning procedure is based on optical and RF phase compensation while tuning the two resonators 112 and 122 of the filter. The tuning is then obtained by linear voltage ratios between the three tuning controls for the filter, the relative optical phase, and the phase of the RF or microwave control signal. The tuning controller 730 can tune the COEO 700 to operate at any of the predetermined signal frequencies by simply setting the controls signals to the corresponding control values in the look-up table. To operate at a desired signal frequency between these predetermined operating frequencies, the tuning controller 720 first sets the control signals to control values for a predetermined signal frequency closest to the desired signal frequency and then changes control signals to tune the frequency from the closest predetermined signal frequency to the desired signal frequency.

TABLE I lists definitions for various device parameters of the COEO 700. Exemplary values of the parameters are also given for a particular implementation of the COEO 700. These values are used in the simulation results to evaluate the performance of the COEO 700 described below.

TABLE I

| Parameter | Symbol | Value | Units |
| --- | --- | --- | --- |
| Loop delay time | $\tau$ | $1/6.2 \times 10^{-6}$ | sec |
| RF section constant phase | $\phi_{RF}$ | −3.4 | rad |
| RF section delay time | $\tau_s$ | $1.876 \times 10^{-7}$ | sec |
| Amplitude factor | $\delta$ | 0.00065 | — |
| Modulator $\alpha$ | $\alpha$ | $2 \times 10^{-11}$ | sec |
| Modulator $\beta$ | $\beta$ | $10^9$ | rad/sec |
| Gain | G | 48 | dB |
| Frequency Offset | $f_0$ | 12.4 | GHz |
| Resonator linewidth HWHM | $f_{LN}$ | 6.9 | MHz |

Figure 8D:
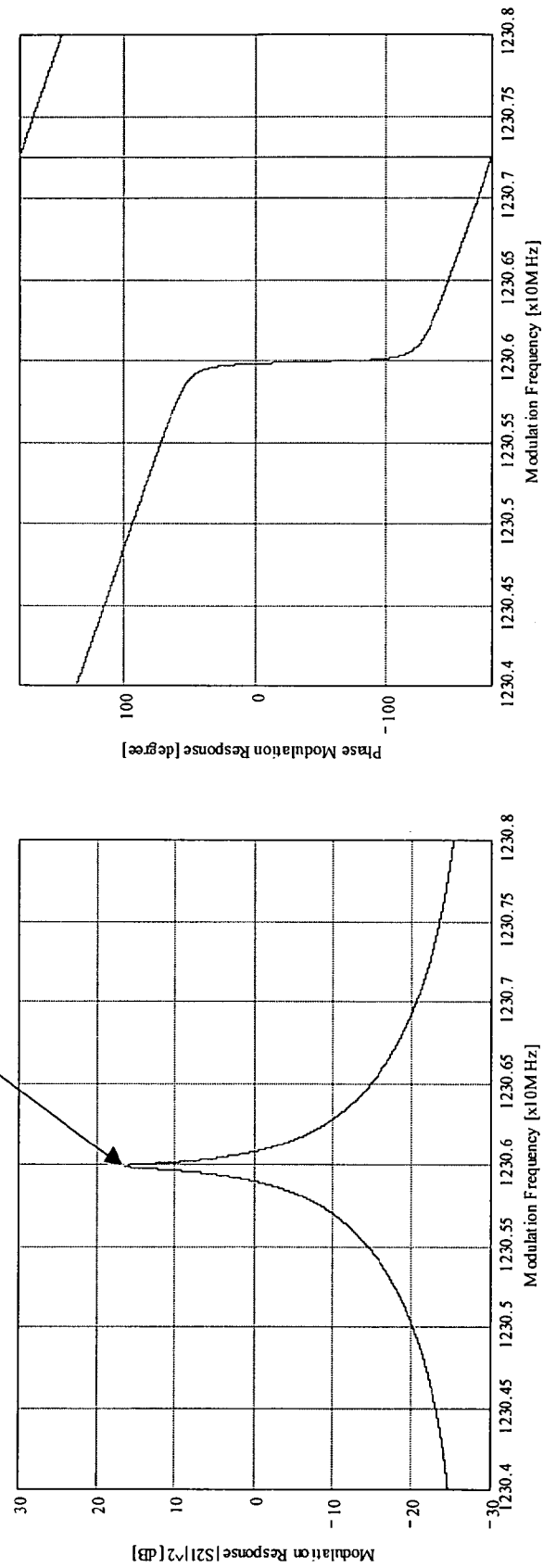

The tuning of the COEO 700 may be performed as follow. The COEO 700 is first initialized with a set of control parameters that provide stable and clean oscillations near a signal frequency f0. The transmission parameter $S_{21}$ of the device can be measured. FIG. 8A illustrates simulated amplitude and phase responses of the S21 at the frequency of 1.2.406 GHz. In order to tune the carrier frequency by $\Delta f$ which may be positive or negative, the two resonators are tuned to change their frequency separation from the initial value f0 to the new separation is f0+Δf. Next, an optical phase shift of Δϕopt=−2π·Δϕ·τ to the optical phase shifter and an RF phase shift of ΔϕRF=−2π·Δϕ·τs is applied to the RF phase shifter. At the new frequency f0+Δf, the new response ($S_{21}$) will exhibit amplitude and phase responses similar to the responses around the peak frequency before the tuning. FIGS. 8B, 8C, and 8D show simulated S21 responses at frequency tunings of −1 MHz, −10 HMz, and −100 MHz, respectively. This characteristics can be obtained as long as the frequency shift is within a certain bandwidth: |Δf|<$f_{BW}$/2, where the tuning bandwidth parameter (fBW) depends on the original set of parameters. Calculations show that for the set values for the parameters listed in TABLE I, the tuning bandwidth (fBW) is on the order of hundreds of MHz. If β=$10^8$ rad/sec, the value of fBW can reach a GHz range or more.

The tuning controller 730 may use analog or digital circuits to generate the analog control signals. FIG. 9A shows an example where the tuning controller 730 uses a common analog voltage source and analog circuits to derive the control signals from the output voltage of the source. In this design, the noise of the analog voltage source is present in all control signals and hence the noise signals in different control signals are correlated and coupled. Therefore, the controls are sensitive to the noise of the analog source. This is undesirable. One advantage of the analog design is the high tuning resolution.

FIG. 9B shows an example where the tuning controller 730 uses a common digital voltage source to supply a digital tuning voltage and digital-to-analog converters to produce the analog. control signals from the digital output of the source. In this design, the noise signals in the analog signals produced by the ADCs are not correlated and hence the operation of the COEO is not as sensitive to the noise as in the analog design in FIG. 9A. The tuning resolution can be improved by using high-bit digital circuits.

FIG. 10 shows another example of a continuously tunable COEO 1000 where an optical-phase shifter 1020 is placed in the common optical path 701 of the closed optical loop to shift the modes of the closed optical loop, in response to a control signal 1010, in order to overlap with the resonant modes of the resonators 112 and 122. The control of the relative optical phase between the two optical paths 110 and 120 in the tunable filter is achieved by the tuning of the resonators 112 and 122 because the tuning of each resonator changes both the resonator frequency and the optical phase shift through the tuned resonator.

In some implementations, two or more optical phase shifters may be used. For example, in the COEO 700 in FIG. 7, a second optical phase shifter may be placed in the first optical path 110. As another example, a second optical phase shifter may be inserted in the second optical path 120 in the filter on the COEO 1000 in FIG. 10 to provide an independent control over the relative optical phase between the two optical paths 110 and 120.

In summary, only a few implementations are disclosed. However, it is understood that variations and enhancements may be made.

What is claimed is:

1. A device, comprising:
   a closed optical loop to produce laser light, the closed optical loop comprising an optical gain medium to amplify light and to modulate an optical gain of the laser light in response to a control signal applied to the optical gain medium;
   an opto-electronic path comprising an optical section coupled to receive a portion of the laser light from the closed optical loop, an electronic section to produce the control signal, and an optical detector coupled between and interconnecting the optical section and the electronic section to covert light in the optical section into an electrical signal in the electronic section, wherein the electronic section produces the control signal from the electrical signal and wherein the opto-electronic path and at least a portion of the closed optical loop form a closed opto-electronic loop to produce an oscillation at a signal frequency;
   a tunable optical filter optically coupled in the closed optical loop to filter the laser light circulating in the closed optical loop, the tunable optical filter comprising:
   an input port to receive the laser light,
   a first optical path coupled to the input port to receive a first portion of the received laser light and comprising a first tunable optical resonator to transmit light at a first resonator resonance frequency,
   a second optical path coupled to the input port to receive a second portion of the laser light and comprising a second tunable optical resonator to transmit light at a second resonator resonance frequency different from the first resonator resonance frequency by the signal frequency, and
   an output port coupled to the first and second optical paths to combine transmitted light from the first and second optical paths to produce an output optical beam into the closed optical loop; and
   a mechanism to adjust a relative optical phase between the first and the second optical paths in response to a change in the signal frequency.

2. The device as in claim 1, further comprising a tuning controller to tune the first and the second resonators to change the signal frequency, wherein the tuning controller further control the mechanism to adjust the relative optical phase between the first and the second optical paths in the tunable optical filter when changing the signal frequency.

3. The device as in claim 2, wherein the opto-electronic path further comprises a second mechanism to control a phase of the control signal to maintain the oscillation at the signal frequency in response to a control by the tuning controller.

4. The device as in claim 3, wherein the tuning controller derives analog control voltages for controlling the first and second optical resonators, the relative optical phase, and the phase of the control signal for continuously tuning the signal frequency from a common analog voltage source.

5. The device as in claim 3, wherein the tuning controller derives analog control voltages for controlling the first and second optical resonators, the relative optical phase, and the phase of the control signal for continuously tuning the signal frequency from a digital tuning source, and the device further comprising digital-to-analog converters to respectively produce the analog control voltages from the digital tuning source.

6. The device as in claim 2, wherein the first and second optical resonators are tunable via an electro-optic effect.

7. The device as in claim 6, wherein the first and second optical resonators comprise a lithium niobate material.

8. The device as in claim 6, the first and second optical resonators are whispering gallery mode resonators.

9. The device as in claim 1, wherein the mechanism to adjust the relative optical phase between the first and the second optical paths comprises an optical phase shifter in one of the first and the second optical paths.

10. The device as in claim 1, wherein the mechanism to adjust the relative optical phase between the first and the second optical paths comprises two separate controls of the first and the second optical resonators to tune the first and second resonator resonance frequency, respectively.

11. The device as in claim 1, wherein the optical section comprises an optical delay element.

12. The device as in claim 11, wherein the optical delay element is a fiber loop.

13. A device, comprising:
a laser to lase at first and second laser frequencies that differ by a signal frequency, the laser comprising a closed optical loop which comprises:
an optical gain medium to produce an optical gain and to amplify light and to modulate the optical gain in response to a control signal applied to the optical gain medium,
a common optical path having a first end and a second end,
a first optical path coupled between the first end and second ends to receive a first portion of light in the closed optical loop and comprising a first optical resonator to transmit light at the first laser frequency, wherein the first optical resonator is tunable to change the first laser frequency, and
a second optical path, parallel to the first optical path, coupled between the first end and second ends to receive a second portion of light in the closed optical loop and comprising a second optical resonator to transmit light at the second laser frequency, wherein the second optical resonator is tunable to change the second laser frequency;
an opto-electronic feedback path comprising an optical section coupled to the laser to receive a portion of light from the closed optical loop, an electronic section to produce the control signal and coupled to the optical gain medium to apply the control signal, and an optical detector coupled between the optical section and the electronic section to covert light in the optical section into an electrical signal in the electronic section, wherein the electronic section produces the control signal from the electrical signal and sustains an oscillation at the signal frequency in the opto-electronic path and at least a portion of the closed optical loop; and
a tuning control mechanism to simultaneously control a relative optical phase between the first and the second optical paths, the first and the second optical resonators, and a phase of the control signal to continuously tune the signal frequency.

14. The device as in claim 13, wherein the tuning control mechanism comprises:
a tuning controller to tune at least one of the first and the second optical resonators to change the difference between the first and second laser frequencies and thus to tune the signal frequency;
an optical phase shifter in at least one of the first and second optical paths to change the relative optical phase; and
a phase shifter in the electrical section of the opto-electronic feedback path to change the phase of the control signal, wherein the tuning of at least one of the first and the second optical resonators, the change in the relative optical phase, and the change in the phase of the control signal are correlated to provide a continuous tuning in the signal frequency without optical mode hopping in the laser.

15. The device as in claim 14, further comprising a common analog voltage source to produce an analog voltage source, and wherein the tuning controller derives analog control voltages for controlling the first and second optical resonators, the optical phase shifter, and the phase shifter from the common analog voltage source.

16. The device as in claim 14, wherein the tuning controller comprises:
a digital tuning source to produce digital signals for controlling the controlling the first and second optical resonators, the optical phase shifter, and the phase shifter, respectively; and
digital-to-analog converters to respectively produce analog control voltages for controlling the first and second optical resonators, the optical phase shifter, and the phase shifter, respectively.

17. The device as in claim 13, wherein the tuning control mechanism comprises:
a tuning controller to tune at least one of the first and the second optical resonators to change the difference between the first and second laser frequencies to tune the signal frequency and a relative optical phase between the first and the second optical paths; and
a phase shifter in the electrical section of the opto-electronic feedback path to change the phase of the control signal when applied to the optical gain medium, wherein the tuning of at least one of the first and the second optical resonators, the associated change in the relative optical phase, and the change in the phase of the control signal are correlated to provide a continuous tuning in the signal frequency without optical mode hopping in the laser.

18. The device as in claim 13, wherein the optical section comprises an optical delay element.

19. The device as in claim 18, wherein the optical delay element is a fiber loop.

20. The device as in claim 13, wherein the first and second optical resonators are tunable via an electro-optic effect.

21. The device as in claim 20, wherein the first and second optical resonators comprise a lithium niobate material.

22. The device as in claim 13, the first and second optical resonators are whispering gallery mode resonators.

* * * * *